(12) United States Patent
Galy et al.

(10) Patent No.: US 8,786,989 B2
(45) Date of Patent: Jul. 22, 2014

(54) ELECTRONIC DEVICE COMPRISING A BUFFER AND MEANS FOR PROTECTING AGAINST ELECTROSTATIC DISCHARGES

(75) Inventors: Philippe Galy, Le Touvet (FR); Jean Jimenez, Saint Théoffrey (FR)

(73) Assignee: STMicroelectronics SA, Montrouge (FR)

( * ) Notice: Subject to any disclaimer, the term of this patent is extended or adjusted under 35 U.S.C. 154(b) by 246 days.

(21) Appl. No.: 13/198,436

(22) Filed: Aug. 4, 2011

(65) Prior Publication Data

US 2012/0050925 A1    Mar. 1, 2012

(30) Foreign Application Priority Data

Aug. 26, 2010  (FR) .................................... 10 56789

(51) Int. Cl.
| | | |
|---|---|---|
| H02H 9/00 | (2006.01) | |
| H01C 7/12 | (2006.01) | |
| H02H 1/00 | (2006.01) | |
| H02H 1/04 | (2006.01) | |
| H02H 3/22 | (2006.01) | |
| H02H 9/06 | (2006.01) | |

(52) U.S. Cl.
USPC ........................................... 361/56; 361/118

(58) Field of Classification Search
USPC ................................................... 361/56, 118
See application file for complete search history.

(56) References Cited

U.S. PATENT DOCUMENTS

| | | |
|---|---|---|
| 6,465,768 B1 | 10/2002 | Ker et al. |
| 6,479,872 B1 | 11/2002 | Cheng et al. |
| 2004/0051146 A1 | 3/2004 | Ker et al. |
| 2008/0062599 A1 | 3/2008 | Kato |
| 2008/0151446 A1 | 6/2008 | Ker et al. |
| 2010/0027173 A1* | 2/2010 | Wijmeersch .................... 361/56 |

FOREIGN PATENT DOCUMENTS

FR    2 784 503    4/2000

OTHER PUBLICATIONS

République Française Institut National De La Propriété Industrielle, Rapport De Recherche Préliminaire (Preliminary Search Report); issued in French Patent Application No. 10-56789 on Mar. 23, 2011 (2 pages).
Galy, PH., et al., "Ideal Gummel curves simulation of high current gain vertical NPN BIMOS transistor," Int. J. Electronics, vol. 80, No. 6, 1996, pp. 717-726.
Parke, S.A. et al., "Bipolar-FET Hybrid-Mode Operation of Quarter-Micrometer SOI MoSFET's," IEEE Electron Device Letters, vol. 14, No. 5, May 1993, pp. 234-236.

* cited by examiner

Primary Examiner — Dharti Patel
(74) Attorney, Agent, or Firm — Slater & Matsil, L.L.P.

(57) ABSTRACT

The electronic device comprises a first terminal and a second terminal, a buffer connected between the first terminal and the second terminal and comprising a signal input, and means for protecting against electrostatic discharges likely to occur across at least a pair of nodes of the buffer. The device comprises at least one integrated structure connected between the two nodes and said signal input, containing at least one MOS transistor and forming both said protection means and at least a part of said buffer.

33 Claims, 5 Drawing Sheets

ELECTRONIC DEVICE COMPRISING A BUFFER AND MEANS FOR PROTECTING AGAINST ELECTROSTATIC DISCHARGES

CROSS-REFERENCE TO RELATED APPLICATION

This application claims the priority benefit of French Patent Application Number 10 56789, filed Aug. 26, 2010, entitled "Electronic device comprising a buffer and means for protecting against electrostatic discharges," which is hereby incorporated by reference to the maximum extent allowable by law.

TECHNICAL FIELD

The invention relates to electronic devices, and especially those comprising a buffer and means intended to protect components against ESD (electrostatic discharge).

BACKGROUND

A buffer is for example incorporated into an I/O cell of an integrated circuit. Conventionally, there are two broad families of buffers.

A first family includes what are called "open-drain" buffers comprising only a single type of MOS transistor. Thus a buffer of this type, for example an output buffer, comprises a MOS transistor, for example an nMOS transistor, the gate of which is intended to receive a signal from another component, the drain of which forms a signal output of the buffer and is connected to the I/O pin of the cell and the source and substrate of which are connected to another pin of the cell intended to be grounded.

The cell moreover comprises protection means (for example diodes or else nMOS transistors the gate of which is directly grounded (gate-grounded nMOS) and the substrate of which is also directly grounded) intended to protect, against electrostatic discharges that may occur across the I/O pin and said other pin, a component connected to these two pins.

A second family includes buffers comprising CMOS transistors (nMOS and pMOS) connected in series via a common node and having their gates connected. The gates then receive for example a signal from another component, and the common connection node, in series, forms a signal output. Here again the cell containing the buffer also includes conventional means for protecting against electrostatic discharges.

SUMMARY OF THE INVENTION

In one aspect, the present invention provides for an electronic device, comprising a first terminal and a second terminal, a buffer connected between the first terminal and the second terminal and comprising a signal input, and means for protecting against electrostatic discharges likely to occur across at least one pair of nodes of the buffer, characterized in that it comprises at least one integrated structure connected between the two nodes and to said signal input, containing at least one MOS transistor and forming both said protection means and at least a part of said buffer.

In another aspect, the present invention provides for an integrated circuit having a comprising a first terminal, a second terminal, and a signal terminal. The integrated circuit has an integrated buffer and electrostatic discharge protection circuit connected between the first terminal and the second terminal, comprising at least one MOS transistor configured to operate at least transiently in a hybrid mode during an electrostatic discharge event occurring between the first or the second terminal and another terminal.

BRIEF DESCRIPTION OF THE DRAWINGS

Other advantages and features of the invention will become clear on examining the detailed description of non-limiting embodiments and the appended drawings in which.

DETAILED DESCRIPTION OF ILLUSTRATIVE EMBODIMENTS

Before specifically describing the illustrated embodiments in detail, various embodiments and advantageous features thereof will be described generally. In one embodiment, it is proposed to reduce, relative to the prior art, the footprint of a device comprising a buffer and ESD protection means.

The use of advanced CMOS technologies, for example the use of 65 nm or sub-65 nm technologies, and in particular 45 or 35 nm technologies, has lead to the use of lower and lower supply voltages.

Because of this, in one embodiment, such an electronic device is provided that is able to turn on, in the presence of electrostatic discharges, at very low voltages so as in particular to limit, to a low value, the overvoltage across the terminals of the component to be protected.

In one embodiment, it is proposed to integrate a MOS-transistor-based buffer and ESD protection means into the same structure, whereas in the prior art this buffer and the ESD protection means were two separate structures.

According to one aspect, an electronic device is thus provided that comprises a first terminal and a second terminal, a buffer connected between the first terminal and the second terminal and comprising a signal input, and means for protecting against electrostatic discharges likely to occur across at least one pair of nodes of the buffer.

According to a general feature of this aspect, the device comprises at least one integrated structure connected between the two nodes and said signal input, containing at least one MOS transistor and forming both said protection means and at least a part of said buffer.

In this respect, and in one embodiment, said at least one MOS transistor, which includes a parasitic bipolar transistor, is configured so as, in the presence of a current pulse across the two nodes, resulting for example from an electrostatic discharge, to operate at least transiently in a hybrid mode including a MOS-type operation in a subthreshold mode and operation of the parasitic bipolar transistor In contrast, when the integrated circuit is operating normally or in the steady-state regime, said at least one MOS transistor is configured so as to behave as an open-drain or CMOS buffer, delivering as output a signal the characteristics of which depend on those of the input signal and on the operating regime of the MOS transistor. Thus, for example, when the MOS transistor is operating in the linear regime, the buffer is a linear amplifier stage whereas it forms a D-class amplifier stage when the MOS transistor is operating in the saturated regime. The MOS transistors may also, especially in the case of a complementary-transistor buffer, operate in a digital mode of operation in the switched-off/saturated regime.

As indicated above, the buffer may be an open-drain or CMOS buffer. Thus, in one embodiment comprising an open-drain buffer, in which the buffer comprises a single MOS transistor or a single group of several MOS transistors of the same conductivity in parallel connected between the first terminal and the second terminal, the two terminals form said pair of nodes. In such a case, said integrated structure forms both the entire buffer and ESD protection means for discharges likely to occur across the two terminals.

In one embodiment comprising a complementary transistor buffer, in which the buffer comprises a first MOS transistor having a first conductivity type or a first group of several first MOS transistors in parallel each having the first conductivity type, a second MOS transistor having a second conductivity type opposite that of the first or a second group of several second MOS transistors in parallel each having the second conductivity type, the first MOS transistor or the first group of MOS transistors being connected in series with the second MOS transistor or the second group of MOS transistors across the first terminal and the second terminal via a common node, one of the two terminals and said common node may form said pair of nodes between which said integrated structure is connected.

In such a case, the integrated structure incorporates one of the complementary transistors, for example the nMOS transistor or transistors, and the structure forms both a part of the buffer and ESD protection means for discharges likely to occur through the transistor or transistors of this part, here the nMOS transistor or transistors.

Conventional ESD protection means may then be envisaged across the terminals of the other complementary transistor or transistors, here the pMOS transistor or transistors.

It is also possible, in an embodiment comprising a complementary-transistor buffer, to provide two integrated structures connected respectively between a first pair of nodes formed by the first terminal and said common node and between a second pair of nodes formed by said common node and the second terminal.

In such a case, each integrated structure incorporates one of the complementary transistors and forms both a part of the buffer and ESD protection means for discharges likely to occur through the transistor or transistors of this part. The two structures together form the entire buffer stage and ESD protection means against discharges that may occur across the two terminals, i.e. propagating through all the complementary transistors.

The hybrid operating principle of a MOS transistor was demonstrated in the article by Ph. Galy and V. Berland entitled "Ideal Gummel curves simulation of high current gain vertical NPN BIMOS transistor", Int. J. Electronics, 1996, Vol. 80, No. 6, pp 717-726, incorporated herein by reference. This article is a theoretical study on a transistor with a vertical structure having a gate length (channel length) of about a micron and validated by simulations—no application whatsoever of this hybrid operation was mentioned.

A four-port microelectronic component combining the bipolar effect and the MOS effect in one hybrid operating mode in order to improve the current gain has also been described in the French patent application No. 2 784 503, incorporated herein by reference. Such a component is presented as being resistant to ionizing radiation and it is specified in a general way that it may be used in mass market, space and/or military applications, in the digital and analogue fields—no application whatsoever of the hybrid operation of the component was mentioned.

The present inventors observed that it was particularly beneficial to use this principle of hybrid operation of the transistor especially to produce a means of protecting a component against electrostatic discharges which result in current pulses across the two terminals of the means (due to a potential difference pulse across these two terminals).

This hybrid operation is obtained when the transistor is configured so that the gate of the MOS transistor is biased with a voltage lower than its threshold voltage and so that the substrate-source voltage difference of the MOS transistor is positive. This positive voltage difference is for example obtained when the substrate of the MOS transistor, which forms the intrinsic base of the parasitic bipolar transistor, is biased with a non-zero voltage whilst the source of the MOS transistor is grounded.

When the configuration conditions of the transistor are set to obtain this hybrid operation, the latter may appear for relatively long gate lengths, for example 1 micron, although, in this case, the hybrid operation is of little use industrially.

In contrast, with technological evolution, the base of the parasitic transistor has become smaller, which is especially the case for 250 nm or sub-250 nm technologies, in particular for 65 nm or sub-65 nm technologies, and more particularly for sub-50 nm technologies, for example 45 nm and 32 nm technologies, making the parasitic bipolar behaviour of the MOS transistor more important.

It then becomes possible to make the MOS transistor operate significantly, at least transiently at the start of the current pulse, below its threshold voltage and, simultaneously, to make the parasitic bipolar transistor operate. And, in such a hybrid operation, the current gain of the bipolar transistor, controlled by the gate voltage of the MOS transistor, may become substantial, reaching as high as several dB.

Thus, this hybrid operation allows such a device to be used to protect against electrostatic discharges with triggering at very low voltages, for example in certain cases about a volt for 45 nm or 32 nm technologies.

This is because, since the current gain Ic/Ib of the bipolar transistor becomes very large when the non-zero gate voltage remains lower than the threshold voltage of the MOS transistor, the current flowing through the transistor will, in the presence of an ESD pulse, very quickly reach significant values, corresponding to the aforementioned trigger threshold, whilst limiting, after this triggering, the voltage across the terminals of the component to be protected to low values, for example about a volt.

This hybrid operation of the transistor thus enables more rapid triggering than that obtained with a conventional ESD protection circuit using for example an nMOS transistor the gate of which is directly grounded (gate grounded nMOS) and the substrate of which is also directly grounded.

Of course if during the pulse the gate-source voltage of the MOS transistor becomes greater than the threshold voltage of this transistor, the MOS transistor passes from the hybrid operating mode to a MOS operating mode.

Several embodiments are possible for the integrated structure coupled between the two nodes of the buffer.

Thus, it is possible to provide a MOS transistor having its first electrode, for example its drain, coupled to a first node, its second electrode, for example its source, coupled to a second node, and its gate coupled to its substrate without being directly coupled to the second node. Moreover, the structure advantageously furthermore comprises a resistive element, or more generally a circuit for controlling the substrate voltage of the MOS transistor, coupled between the substrate of the MOS transistor and the second node.

This control circuit is thus especially configured to allow the voltage of the substrate to rise as a function of the current flowing through the control circuit. A resistive element, such as a resistor or a MOS transistor acting as resistor, is a particularly simple embodiment thereof. Even so, a current generator, a capacitor or an inductor could, for example, be used.

With such a transistor configuration, the transistor will pass, in the presence of an electrostatic discharge applied across the two nodes, at least transiently, at the start of the electrostatic discharge, into its hybrid operating mode because the substrate and gate are at least transiently biased so as to obtain a hybrid operation.

Even so, although this hybrid operation appears with such a configuration in 1 µm technologies (1 µm gate length), this operation becomes of more and more substantial benefit, in ESD protection applications especially, when the gate length is reduced. Thus such ESD protection devices have been fabricated using 250 nm technologies. These ESD protection devices have proved moreover to be particularly suited to advanced technologies, such as for example 65 nm and sub-65 nm technologies, in particular 32 nm technology.

Such an embodiment allows the bipolar and MOS effects to be combined simultaneously whilst amplifying them and reducing leakage currents.

Moreover, in the steady-state regime, when the MOS transistor of the buffer is an nMOS transistor, the resistive element allows the substrate of the nMOS transistor to be grounded.

This being so, in another embodiment said structure furthermore comprises said at least one MOS transistor possessing a first electrode connected to said first node, a second electrode connected to the second node, and a gate connected to said signal input, an additional MOS transistor possessing a first electrode connected to the gate of said MOS transistor, a second electrode connected to the substrate of said MOS transistor, the gate and the substrate of the additional transistor being connected together, and a control circuit, such as a resistive element, connected between the substrate of said at least one MOS transistor and the second node, and configured so as to control the substrate voltage of said at least one MOS transistor.

The additional MOS transistor is therefore configured so that it also passes at least transiently into a hybrid operating mode in the presence of an ESD pulse, thereby consequently allowing the combined bipolar and MOS effects of said transistor to be further amplified.

The structure may furthermore comprise an additional resistive element connected between the substrate and the first electrode of the additional transistor.

In another embodiment, said structure furthermore comprises a supplementary transistor possessing a first electrode connected to the first node, a second electrode connected to the substrate of said MOS transistor, the gate and the substrate of the supplementary transistor being connected together.

Here again the supplementary MOS transistor is therefore configured so that it passes at least transiently into a hybrid operating mode in the presence of an ESD pulse, thereby allowing a higher drain-source current to be obtained from the MOS transistor.

The structure may also furthermore comprise a supplementary resistive element connected between the substrate and the second electrode of the supplementary transistor.

According to another aspect, an integrated circuit comprising an electronic device as defined above is provided. This device may be incorporated for example into an I/O cell of the integrated circuit or else in the core of the latter.

Figure 1:
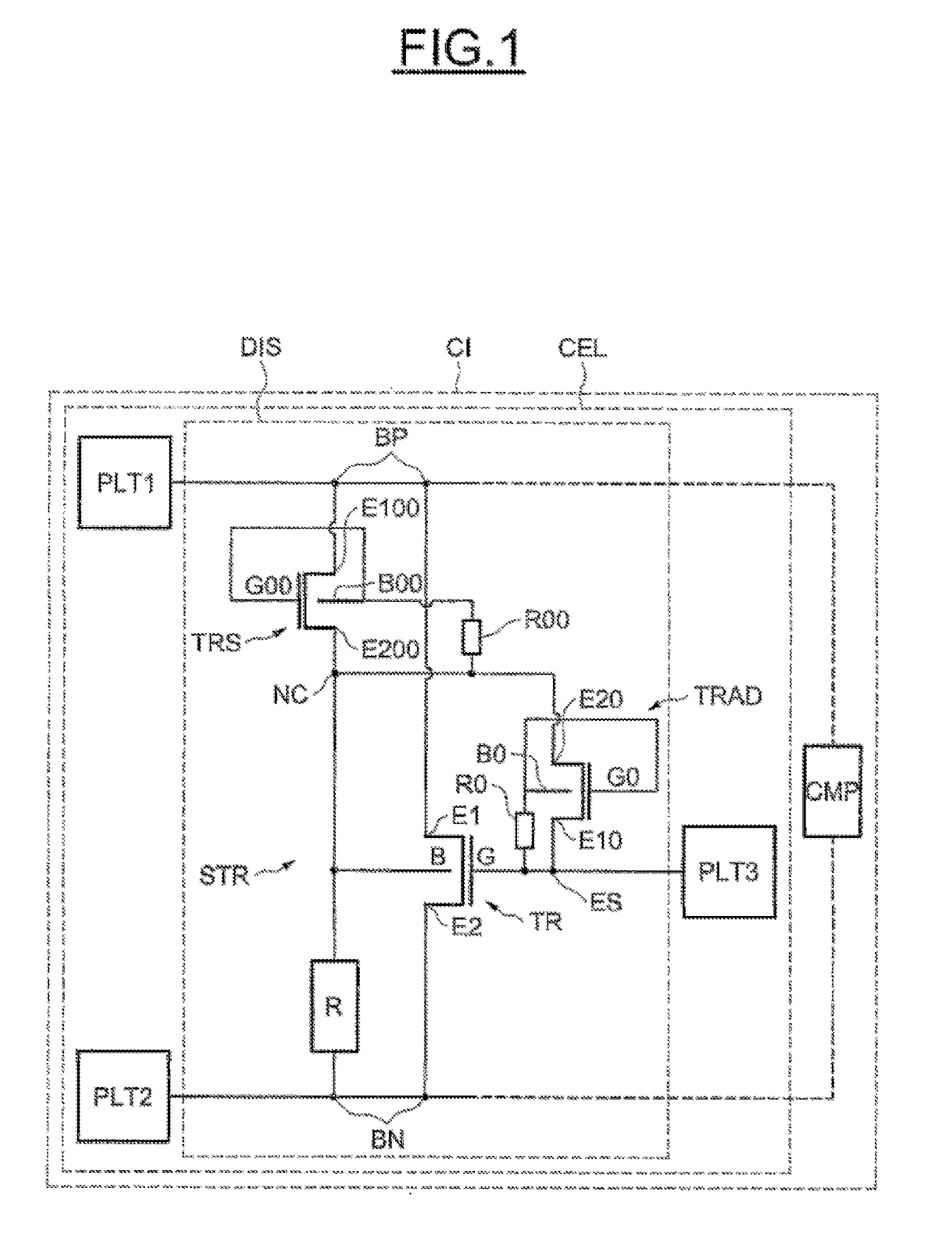
FIGS. 1 to 5 illustrate very schematically various embodiments of an electronic device according to the invention.

In FIG. 1, the reference DIS denotes an electronic device comprising an integrated structure STR connected between a first terminal BP and a second terminal BN and forming, in this variant, both an open-drain buffer and means for protecting against electrostatic discharges that may occur across these two terminals or nodes. A component CMP may be connected to the first terminal BP and to the second terminal BN of the device DIS.

By way of indication, when the component CMP (or the integrated circuit in which it is located) is operating, i.e. when it is in the steady-state regime, the terminal BP may be at a positive voltage Vp and the terminal BN may be connected to a negative voltage Vn or grounded.

When the component CMP is not operating, it may be subjected to an electrostatic discharge typically resulting in a very short current pulse (typically a few microseconds), the peak current of which may reach for example about 30 A in a nanosecond.

It then is necessary for this current pulse to flow through the device DIS and not through the component CMP to be protected.

The device DIS consequently is intended to absorb this current pulse and to prevent overvoltages across the terminals of the component CMP.

In the steady-state regime, the device DIS forms here an open-drain buffer.

More precisely, the device DIS comprises an integrated structure STR connected between the first terminal BP and the second terminal BN and a signal input ES. This structure STR contains a MOS transistor TR, here an nMOS transistor, and forms both the buffer and the means for protecting against electrostatic discharges.

Figure 2:
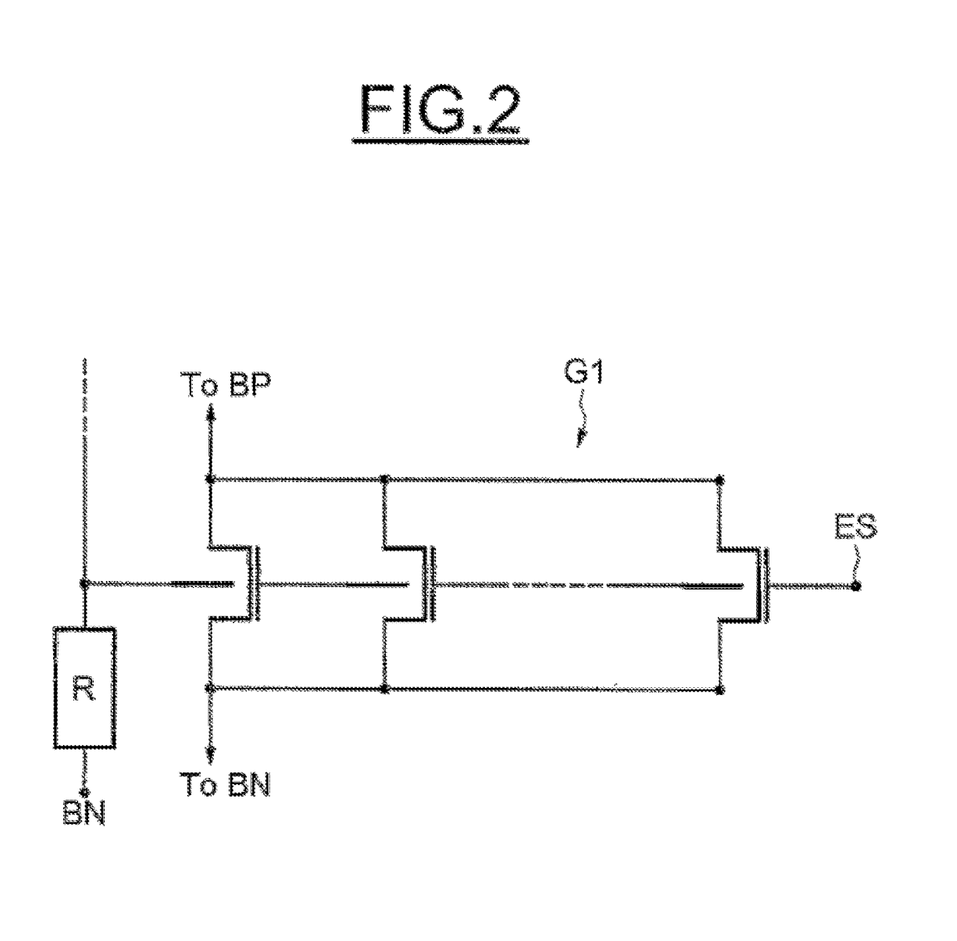

In certain applications, it may be necessary, as illustrated in FIG. 2, to provide not one transistor TR but a group G1 of several transistors of the same conductivity, for example several nMOS transistors, in parallel, especially having their respective gates connected and their respective substrates connected.

In the remainder of the text only a single transistor TR will be considered, but the explanations and descriptions that will be given in respect of this one transistor TR would be valid for all the transistors of the group.

The transistor TR comprises a first electrode E1, for example the drain, connected to the first terminal BP, and a second electrode E2, for example the source, connected to the second terminal BN. The transistor TR also comprises a gate G forming the signal input ES of the buffer.

The structure STR moreover comprises in this example a resistive element R connected between the second terminal BN and the substrate B of the transistor TR.

In this example embodiment, the substrate of the transistor TR is connected to the gate G of this transistor via an additional transistor TRAD, here an nMOS transistor.

More precisely, this transistor TRAD comprises a first electrode E10, for example the source, connected to the gate G of the transistor TR, and a second electrode E20, for example the drain, connected to the substrate B of the transistor TR. Moreover, the gate G0 and the substrate B0 of the transistor TRAD are connected.

The structure STR also comprises a supplementary transistor TRS, here an nMOS transistor. The supplementary transistor TRS possesses a first electrode E100, for example the drain, connected to the first terminal BP, and a second electrode E200, for example the source, connected to the substrate B of the transistor TR. Moreover, here again, the substrate B00 and the gate G00 of the transistor TRS are connected.

Each transistor TR, TRAD and TRS is fabricated in 250 nm technology. In other words, the gate length of these transistors is 250 nm.

Moreover, each of these transistors is configured to operate, at least transiently, in a hybrid operating mode in the presence of an electrostatic discharge.

In the presence of a positive electrostatic discharge, i.e. a discharge that generates a positive potential difference across the terminal BP and the terminal BN (generating a current pulse that propagates from terminal BP to terminal BN), this discharge is transmitted via the drain-substrate capacitance $C_{DB}$ into the substrate B of the transistor TR, and via the drain-gate capacitance $C_{DG}$ into the gate G of the transistor TR. This is because, in the presence of a high potential at the terminal BP and a low potential at the terminal BN, the electrode E1 of the transistor TR is its drain whereas the electrode E2 of the transistor TR is its source.

The current pulse is converted by the resistor R into a substrate-source voltage $V_{BS}$ and into a gate-source voltage $V_{GS}$.

The presence of the capacitance $C_{DB}$, which is very large relative to the capacitance $C_{DG}$, and the connection between the substrate B and the gate G of the transistor TR allow bipolar and MOS effects to be combined and amplified. This is because, since the capacitance $C_{DB}$ is very large relative to the capacitance $C_{DG}$, the pulse transmitted to the gate is smaller than that transmitted to the substrate. Moreover, the presence of the connection between the gate G and the substrate B of the transistor TR causes the bias on the gate to increase (by way of the pulse transmitted via the capacitance $C_{DG}$ and by way of the pulse transmitted to the substrate) and consequently these combined effects are amplified, because the closer the gate voltage comes to the threshold voltage of the MOS transistor, the higher the current gain.

Moreover, the larger the product $R \times C_{DB}$, the lower the trigger voltage or trigger threshold of the device DIS.

Thus, depending on the technology used, the value of R especially will be chosen so as to provide an acceptable trigger threshold compatible with a subthreshold operation of the MOS transistor.

By way of indication, in a 250 nm technology, the capacitance $C_{DB}$ is equal to 0.47 fF/μm and the capacitance $C_{DG}$ is equal to 0.36 fF/μm.

Then, for example, a resistor R of 100 kΩ resistance will be chosen.

The transistor TR passes at least transiently at the start of the pulse into its hybrid operating mode. Of course, if the gate-source voltage of the transistor TR becomes greater than the threshold voltage of the MOS transistor, the latter passes into a MOS operating mode.

The current resulting from the electrostatic discharge therefore flows through the structure STR from the terminal BP to the terminal BN.

The transistors TRS and TRAD, which will also pass at least transiently into their hybrid operating mode in the presence of the positive ESD pulse, will contribute to the amplification of the combined bipolar and MOS effects of the transistor TR.

More precisely, at the start of the positive ESD pulse, the bipolar and MOS effect of the transistor TRS is obtained by the gate-substrate capacitive coupling formed between the capacitors $C_{DB}$ and $C_{DG}$ of the transistor TRS. This effect is amplified by the electrical connection between the gate and the substrate of the transistor TRS. The transistor TRS consequently injects a current into the common node NC between the transistor TRAD and the substrate B of the transistor TR. There is consequently an additional injection of current into the base B of the parasitic bipolar transistor of the transistor TR via the transistor TRS.

The additional transistor TRAD also passes at the start of the ESD pulse into its hybrid operating mode, thereby contributing to the biasing of the gate G of the transistor TR.

The additional current delivered by the transistor TRS is strongly amplified due to the operation of the transistor TRS in its hybrid mode, thus thereby conferring a better drain-source current on the transistor TR. By way of indication, in the absence of the transistor TRS, the drain current is 50% lower. For example, the peak in the drain current of the transistor TR is 32 A without the transistor TRS whereas it is 47 A with the transistor, namely an increase of 15 A.

Moreover, the voltage developed across the terminals of the dipole BP BN (and consequently the voltage across the terminals of the component CMP) is by way of example about 8 volts (trigger threshold), which is much lower than the trigger threshold obtained with a conventional protection means such as a GG nMOS (gate-grounded nMOS) transistor for which the trigger threshold would be about 15 V.

In the presence of a negative ESD pulse, i.e. with a high potential at the terminal BN and a low potential at the terminal BP, the electrode E2 of the transistor TR forms the drain of this transistor whereas the electrode E1 forms the source.

At the start of the pulse, current flows through the resistance R, thereby transmitting the discharge to the transistors TRS and TRAD, which then pass into their hybrid operating mode. There is therefore a base current in the parasitic bipolar transistor of the transistor TR and a bias on the gate of this transistor TR. The latter therefore passes into its hybrid operating mode, the effects of which are amplified by the connection between the substrate B and the gate G and by the presence of the two transistors TRS and TRAD.

Moreover, when the voltage exceeds the threshold voltage of a diode (about 0.6 V), current also flows through the conducting diode of the substrate-source junction (electrode E2) of the transistor TR.

The peak current is then about 33 A for a voltage of 12 V.

It should also be noted that, in the absence of the transistor TRS, the structure responds in a similar way. This is because the resistor R also transmits the electrostatic pulse to the transistor TRAD, which biases the gate of the transistor TR and, as the resistor also biases the base of the parasitic bipolar transistor of the transistor TR, a hybrid operating mode is also obtained.

As a variant, it is possible to insert an additional resistive element R0 between the substrate B0 of the additional transistor TRAD and its first electrode E10, and a supplementary resistive element R00 between the substrate B00 of the supplementary transistor TRS and its second electrode E200.

These resistive elements R0 and R00 allow the trigger sensitivity of the hybrid operating modes of the transistors TRAD and TRS to be improved, in the same way that the resistive element R makes the transistor TR more sensitive.

When the integrated circuit is operating normally or in the steady-state regime, the transistors TRAD and TRS are in the off-state. The MOS transistor TR is configured so as to behave as an open-drain buffer, delivering as output (here the drain E1) a signal the characteristics of which depend on those of the input signal present at the signal input ES, and on the operating regime of the MOS transistor TR. Thus, if the transistor TR is operating in the linear regime, the buffer is then a linear amplifier whereas it forms a D-class amplifier when the transistor TR is operating in the saturated regime.

The device described above thus allows a buffer and ESD protection means to be produced within the same structure having a very small footprint. The transistors TRAD and TRS may be transistors having a small gate length (for example 10 microns).

Moreover, the device has a very low capacitance and very small leakage currents.

In the example illustrated in the figure, the device DIS is incorporated within an I/O cell CEL of an integrated CI. In this respect, the terminal BP of the device DIS is connected to a pin PLT1 whereas the terminal BN is connected to a pin PLT2 and the signal input ES is connected to a pin PLT3. The signal delivered to the pin PLT3 may come, for example, from the component CMP or else from another component of the integrated circuit. The buffer of the device DIS is therefore here an output stage in that it receives a signal from the core of the integrated circuit and transmits a signal to the exterior of the integrated circuit.

As a variant, the device DIS could be incorporated within the very core of the integrated circuit CI, and form for example an input buffer.

Although in the example described above one or more nMOS transistors were used, the invention is also equally applicable to one or more pMOS transistors. More precisely, for example, the source of the pMOS transistor TR remains connected to the terminal BN, which is likely to receive a positive voltage Vdd, and the drain of the pMOS transistor TR remains connected to the terminal BP, which is this time round likely to receive a negative or zero voltage.

Of course, on account of the symmetry of a MOS transistor with respect to its two electrodes, a first electrode of the transistor coupled to the first terminal BP effectively forms the drain or source of the MOS transistor whereas the second electrode, coupled to the second terminal BN, effectively forms the source or drain of the transistor, depending on the direction of the current pulse.

The invention is not limited to the embodiment described above but includes all variants thereof.

Figure 3:
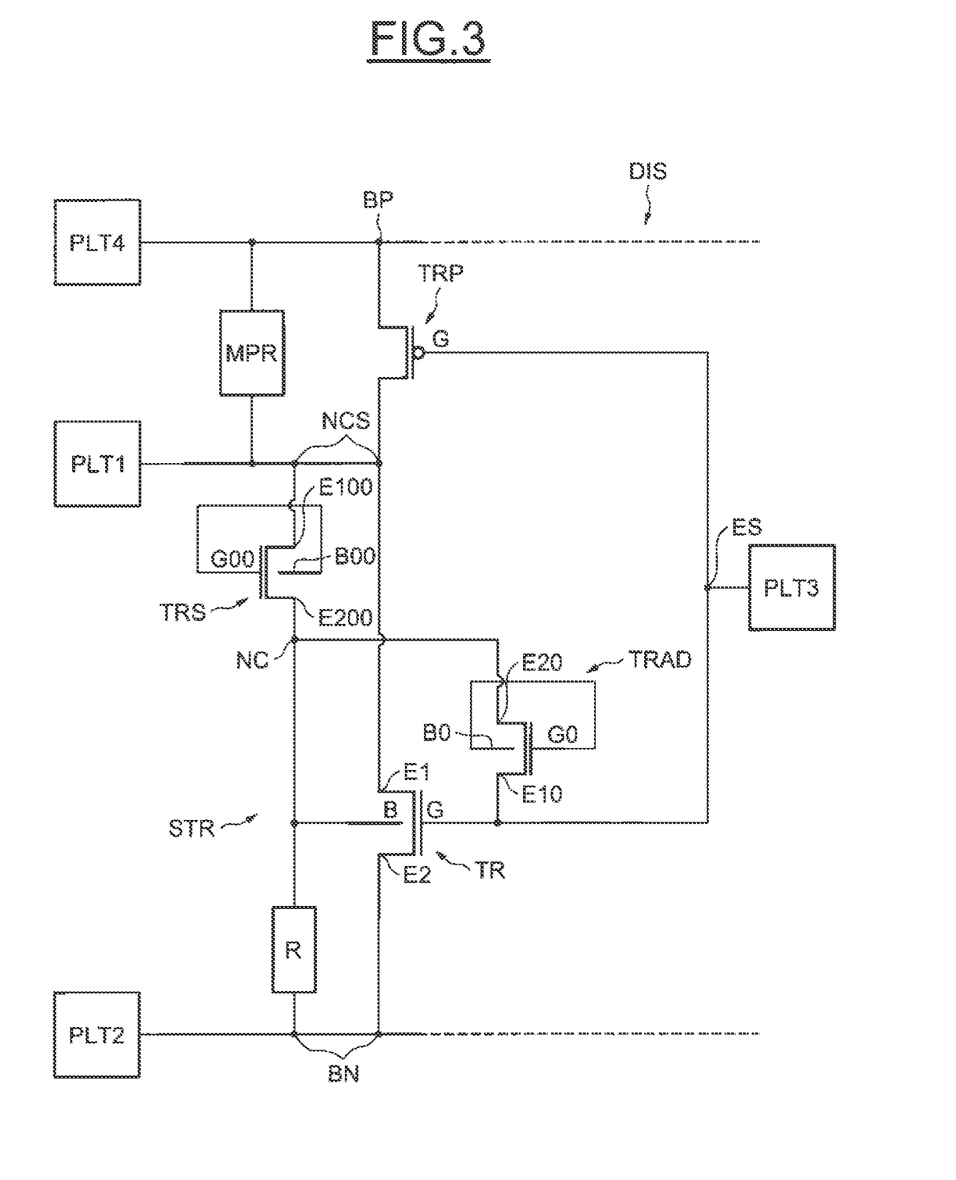
Figure 4:
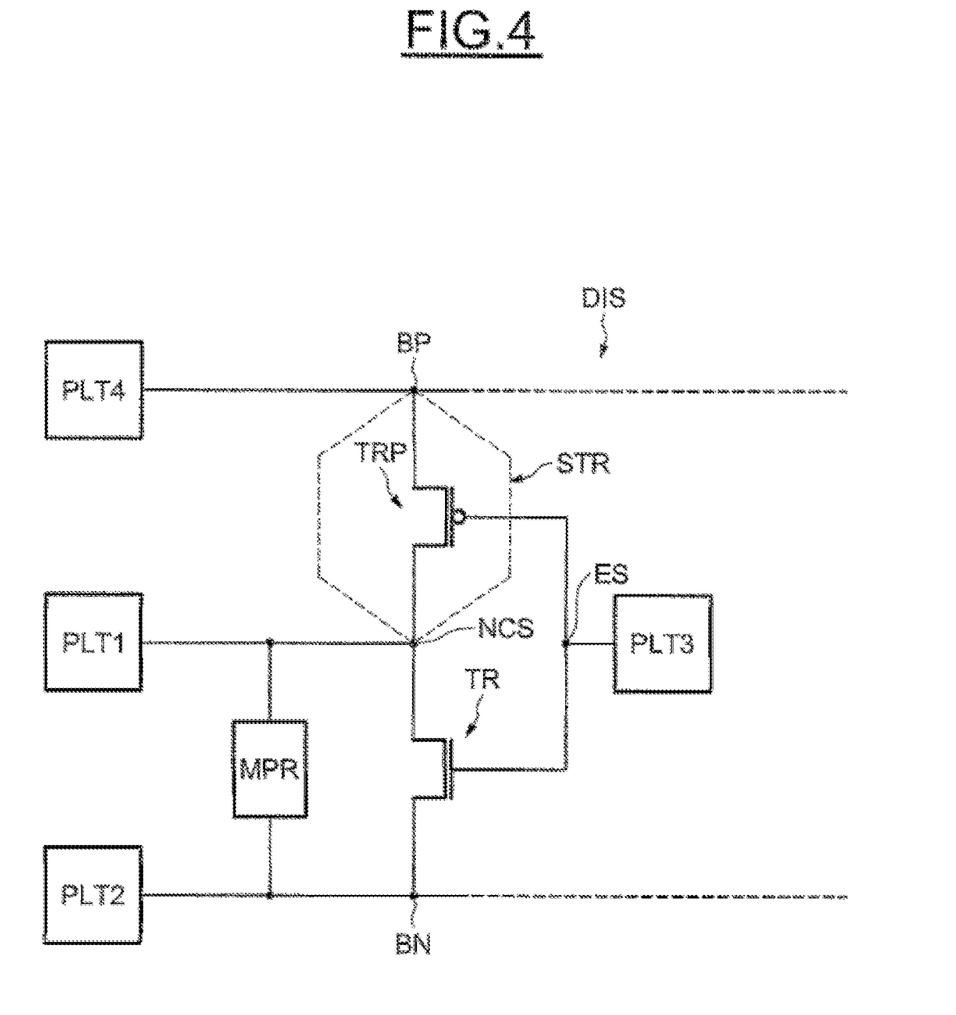
Figure 5:
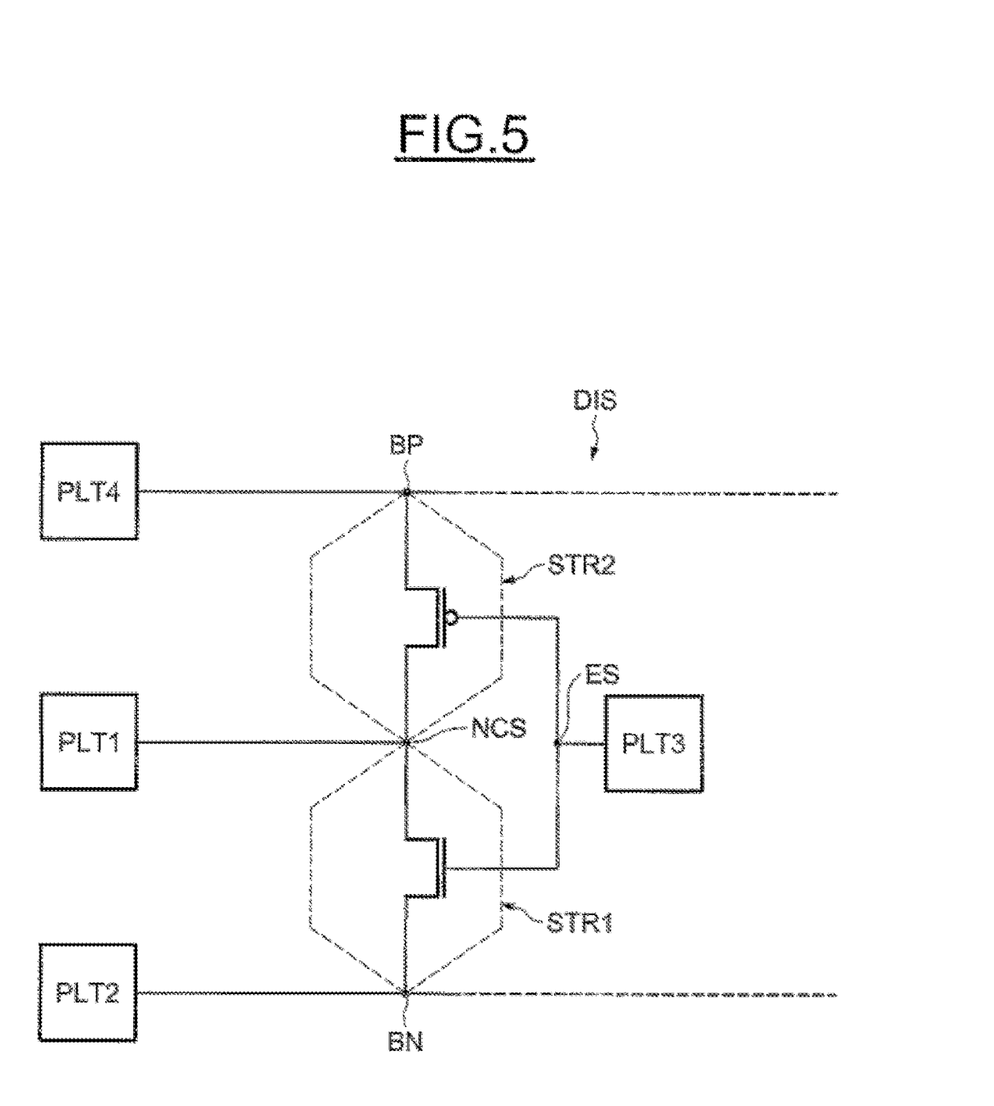

Thus, as illustrated in FIGS. 3 to 5, the buffer may be a CMOS buffer.

More precisely, as illustrated in FIG. 3, the buffer comprises a first MOS transistor TR having a first conductivity type, here an nMOS transistor (or a first group of several first MOS transistors in parallel each having the first conductivity type) and a second MOS transistor TRP, here a pMOS transistor, having a second conductivity type opposite that of the first (or a second group of several second MOS transistors in parallel each having the second conductivity type).

The first MOS transistor TR (or the first group of MOS transistors) is connected in series with the second MOS transistor TRP (or the second group of MOS transistors) between the first terminal BP and the second terminal BN via a common node NCS.

In the steady-state regime, the pin PLT4 connected to the terminal BP receives a positive supply voltage whereas the pin PLT2 is grounded.

The pin PLT1 is still the I/O pin of the cell and the pin PLT3 connected to the signal input ES is connected to the core of the integrated circuit.

In this embodiment, the second terminal BN and said common node NCS form the pair of nodes between which the previously described integrated structure STR is connected.

The integrated structure therefore incorporates here one of the complementary transistors, for example the nMOS transistor or transistors, and this structure forms both a part of the buffer and ESD protection means for discharges likely to occur across the nodes NCS and BN through the transistor or transistors of this part, here the nMOS transistor or transistors.

Conventional ESD protection means MPR, such as diodes for example, may then be envisaged between the nodes BP, NCS or the other complementary transistor or transistors, here the pMOS transistor or transistors.

In the embodiment in FIG. 4, the first terminal BP and said common node NCS form the pair of nodes between which the previously described integrated structure STR is connected. This structure STR is of course connected symmetrically with respect to the structure STR in FIG. 3, i.e. the resistive element R is connected to the terminal BP.

The integrated structure therefore incorporates here the pMOS transistor or transistors, and this structure forms both another part of the buffer stage and ESD protection means for discharges likely to occur across the nodes BP and NCS through the transistor or transistors of this other part, here the pMOS transistor or transistors.

Conventional ESD protection means MPR, such as diodes for example, may then be envisaged between the nodes BN, NCS of the other complementary transistor or transistors, here the nMOS transistor or transistors.

In the embodiment in FIG. 5, the device DIS comprises two integrated structures STR2, STR1 as previously described, respectively connected between a first pair of nodes formed by the first terminal BP and said common node NCS and between a second pair of nodes formed by said common node NCS and the second terminal BN. Here again, as indicated above, the two structures STR1, STR2 are connected symmetrically about the common node NCS.

Each integrated structure therefore incorporates one of the complementary transistors and it forms both a part of the buffer and ESD protection means for discharges likely to occur across the two corresponding nodes through the transistor or transistors of this part. The two structures form together the entire buffer and ESD protection means against discharges that may possibly occur across the two terminals BP and BN, i.e. propagating through all the complementary transistors.

The invention described above is applicable to any integrated technology, whether a technology on a bulk substrate or an SOI (silicon-on-insulator) technology.

What is claimed is:

1. An integrated circuit comprising:
   a first terminal;
   a second terminal;
   a signal terminal;
   an integrated buffer and electrostatic discharge protection circuit connected between the first terminal and the second terminal, the integrated buffer and electrostatic discharge protection circuit comprising a MOS transistor configured to operate as part of both a buffer and an electrostatic discharge protection circuit; and
   logic circuitry configured to receive a logic signal from the buffer and to be protected against electrostatic discharge by the electrostatic discharge protection circuit.

2. The integrated circuit of claim 1, wherein the MOS transistor is configured to operate at least partially in a hybrid mode during an electrostatic discharge event occurring between the first terminal and the second terminal.

3. The integrated circuit of claim 1, wherein the integrated buffer and electrostatic discharge protection circuit comprises;
   the MOS transistor coupled between the first terminal and the second terminal;
   a second MOS transistor coupled between the first terminal and a common node; and
   a resistive element coupled between the common node and the second terminal.

4. The integrated circuit of claim 3, further comprising an additional transistor coupled between a gate of the MOS transistor and the common node.

5. The integrated circuit of claim 3, further comprising a second electrostatic discharge protection circuit coupled between the common node and the second terminal.

6. The integrated circuit of claim 5, wherein the second electrostatic discharge protection circuit comprises a diode.

7. The integrated circuit of claim 6, wherein the integrated buffer and electrostatic protection circuit comprises a CMOS buffer.

8. The integrated circuit of claim 1, wherein the signal terminal is coupled to a gate of the MOS transistor.

9. The integrated circuit of claim 1, wherein the first and second terminals are input/output pads of the integrated circuit.

10. The integrated circuit of claim 1, further comprising a plurality of additional MOS transistors coupled in parallel with the MOS transistor between the first and second terminals.

11. The integrated circuit of claim 1, wherein
the MOS transistor has a current path coupled between the first terminal and the second terminal, and wherein the MOS transistor has a control terminal coupled to the signal terminal, and
the integrated buffer further comprises a control circuit coupled to a substrate contact of the MOS transistor, the control circuit configured to control a substrate voltage of the MOS transistor.

12. The integrated circuit of claim 11, wherein the control circuit comprises a second MOS transistor.

13. The integrated circuit of claim 12, wherein the control circuit further comprises a third MOS transistor coupled between the first terminal and the substrate contact of the MOS transistor.

14. The integrated circuit of claim 13, wherein a control terminal of the second MOS transistor is coupled to a substrate contact terminal of the second MOS transistor and a control terminal of the third MOS transistor is coupled to a substrate contact terminal of the third MOS transistor.

15. The integrated circuit of claim 13, wherein each MOS transistor has a gate length of less than 1 micrometer.

16. The integrated circuit of claim 11, wherein the MOS transistor is configured to operate at least transiently in a hybrid mode during an electrostatic discharge event between the first terminal and the second terminal, wherein the hybrid mode includes both a MOS transistor type current and a bipolar transistor type current.

17. The integrated circuit of claim 11, wherein the MOS transistor comprises a plurality of MOS transistors of a same conductivity type connected in parallel.

18. An integrated circuit comprising:
a first terminal;
a second terminal;
a signal terminal; and
an integrated buffer and electrostatic discharge protection circuit connected between the first terminal and the second terminal, comprising at least one MOS transistor configured to operate at least transiently in a hybrid mode during an electrostatic discharge event occurring between the first or the second terminal and another terminal, wherein the at least one MOS transistor comprises a plurality of MOS transistors coupled in parallel with one another.

19. An integrated circuit comprising:
a first terminal;
a second terminal;
a signal terminal;
an integrated buffer and electrostatic discharge protection circuit connected between the first terminal and the second terminal, comprising at least one MOS transistor configured to operate at least transiently in a hybrid mode during an electrostatic discharge event occurring between the first or the second terminal and another terminal; and logic circuitry configured to receive a logic signal from the integrated buffer and to be protected against electrostatic discharge by the integrated electrostatic discharge protection circuit.

20. An integrated circuit comprising:
a first terminal;
a second terminal;
a signal terminal;
an integrated buffer and electrostatic discharge protection circuit connected between the first terminal and the second terminal, the integrated buffer and electrostatic discharge protection circuit comprising:
a first MOS transistor having a current path coupled between the first terminal and the second terminal, wherein the first MOS transistor has a control terminal coupled to the signal terminal, and
a control circuit coupled to a substrate contact of the first MOS transistor, the control circuit configured to control a substrate voltage of the MOS transistor; and
a first additional MOS transistor of a conductivity type opposite from the first MOS transistor, the first additional MOS transistor having a current path coupled between the second terminal and a third terminal and having a control terminal coupled to the signal terminal.

21. The integrated circuit of claim 20, wherein the first additional MOS transistor comprises a portion of the integrated buffer and electrostatic discharge protection circuit.

22. The integrated circuit of claim 20, further comprising:
a second additional MOS transistor having a source/drain coupled to a substrate contact of the first additional MOS transistor;
a third additional MOS transistor having a source/drain coupled to the substrate contact of the first additional MOS transistor; and
a resistive element coupled between the substrate contact of the first additional MOS transistor and the third terminal.

23. The integrated circuit of claim 20, further comprising a further electrostatic discharge protection circuit coupled between the second and third terminals and in parallel with the first additional MOS transistor.

24. An integrated circuit comprising:
a first terminal;
a second terminal;
a third terminal;
a first MOS transistor having a current path coupled between the first terminal and the second terminal, having a control terminal coupled to the third terminal, and having a substrate contact;
a second MOS transistor having a current path coupled between the third terminal and the substrate contact of the first MOS transistor;
a first resistive element coupled between the second terminal and the substrate contact of the first MOS transistor;
a third MOS transistor coupled between the first terminal and the substrate contact of the first MOS transistor; and
a second resistive element coupled between the third terminal and a substrate contact of the second MOS transistor.

25. The integrated circuit of claim 24, wherein a control terminal of the second MOS transistor is coupled to a substrate contact of the second MOS transistor and wherein a control terminal of the third MOS transistor is coupled to a substrate contact of the third MOS transistor.

26. The integrated circuit of claim 24, further comprising a third resistive element coupled between the substrate contact of the first MOS transistor and a substrate contact of the third MOS transistor.

27. The integrated circuit of claim 24, wherein the first MOS transistor comprises a plurality of MOS transistors of a same conductivity type connected in parallel.

28. The integrated circuit of claim 24, wherein the integrated circuit comprises a buffer connected between the first terminal and a fourth terminal, and wherein the buffer comprises the first MOS transistor and an additional MOS transistor of a second conductivity type opposite that of the first MOS transistor, the additional MOS transistor having a current path coupled between the second terminal and the fourth terminal.

29. The integrated circuit of claim 28, wherein the integrated circuit further comprises:
a second additional MOS transistor having a source/drain coupled to a substrate contact of the additional MOS transistor;
a third additional MOS transistor having a source/drain coupled to the substrate contact of the additional MOS transistor; and
a second resistive element coupled between the substrate contact of the additional MOS transistor and the fourth terminal.

30. A method of operating a semiconductor device that includes an integrated buffer and electrostatic discharge protection circuit comprising a MOS transistor, wherein the method comprises:
during normal operation, buffering an input signal with the MOS transistor by:
receiving the input signal at a gate of the MOS transistor;
supplying a buffered output to an output terminal via a first source/drain terminal of the MOS transistor;
during an electrostatic discharge event, operating the MOS transistor at least transiently in a hybrid mode to provide a discharge current path, wherein operating in the hybrid mode comprises:
generating a MOS transistor type sub-threshold current in the MOS transistor; and
generating a bipolar transistor type current in the MOS transistor dependent on a source-substrate voltage applied to the MOS transistor.

31. The method of claim 30, wherein the discharge path include the first source/drain terminal of the MOS transistor and a second source/drain second terminal of the MOS transistor.

32. The method of claim 30, further comprising regulating a voltage on a substrate contact of the MOS transistor, wherein regulating the voltage on the substrate contact of the MOS transistor comprises, during the electrostatic discharge event, providing a positive voltage to the substrate contact operable to enable the bipolar transistor type current.

33. The method of claim 30, further comprising operating a second MOS transistor coupled to a substrate of the MOS transistor and a third MOS transistor coupled to the substrate of the MOS transistor at least transiently in the hybrid mode during an electrostatic discharge event.

* * * * *